United States Patent
Fukuda et al.

(10) Patent No.: US 7,532,075 B2
(45) Date of Patent: May 12, 2009

(54) BIAS CIRCUIT

(75) Inventors: Atsushi Fukuda, Yokosuka (JP); Hiroshi Okazaki, Zushi (JP); Shoichi Narahashi, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 0 days.

(21) Appl. No.: 11/924,027

(22) Filed: Oct. 25, 2007

(65) Prior Publication Data
US 2008/0100383 A1    May 1, 2008

(30) Foreign Application Priority Data

Oct. 25, 2006  (JP)  ............... 2006-290385
Oct. 17, 2007  (JP)  ............... 2007-269798

(51) Int. Cl.
*H03F 3/04* (2006.01)
(52) U.S. Cl. ...................... 330/296; 330/305
(58) Field of Classification Search ......... 330/285–286, 330/296, 302
See application file for complete search history.

(56) References Cited

U.S. PATENT DOCUMENTS

| | | | |
|---|---|---|---|
| 5,905,409 A * | 5/1999 | Fujimoto et al. ........... | 330/302 |
| 6,011,446 A | 1/2000 | Woods | |
| 6,124,767 A | 9/2000 | Woods | |
| 6,140,892 A | 10/2000 | Uda et al. | |
| 6,768,383 B2 * | 7/2004 | Kushitani et al. ........... | 330/302 |
| 2005/0052579 A1 * | 3/2005 | Yamamoto .................. | 348/736 |
| 2006/0202764 A1 | 9/2006 | Fukuda et al. | |
| 2008/0100383 A1 | 5/2008 | Fukuda et al. | |

FOREIGN PATENT DOCUMENTS

| | | |
|---|---|---|
| EP | 1 703 634 A1 | 9/2006 |
| EP | 1 713 144 A1 | 10/2006 |
| JP | 11-150431 | 6/1999 |
| JP | 2001-267864 | 9/2001 |
| JP | 2003-101440 | 4/2003 |
| JP | 2006-254378 | 9/2006 |

OTHER PUBLICATIONS

U.S. Appl. No. 12/115,853, filed May 6, 2008, Fukuda et al.

(Continued)

*Primary Examiner*—Robert Pascal
*Assistant Examiner*—Hieu P Nguyen
(74) *Attorney, Agent, or Firm*—Onlon, Spivak, McClelland, Maier & Neustadt, P.C.

(57) ABSTRACT

A bias circuit 100 comprises: a first reactance means 2 connected to an AC circuit; a second reactance means 3 connected to the first reactance means 2; a switch 7 connected to a connection point 210 between them; a third reactance means 8 connected to the switch 7; a capacitive means 4 connected to the second reactance means 3; and a DC circuit 5 connected to a connection point 220 between the second reactance means 3 and the capacitive means 4; wherein the connection point 220 is grounded in terms of alternating current. The connection point 210 is at a position such that impedance as viewed from the connection point 210 toward the capacitive means 4 is sufficiently large at a second frequency different from a first frequency. Impedance as viewed from a bias point 800 toward the bias circuit is sufficiently large at any of the frequencies.

17 Claims, 12 Drawing Sheets

OTHER PUBLICATIONS

Atsushi Fukuda, et al. "Power Amplifier for Broadband Applications Beyond the Third-Generation-Multi-band, High-efficiency Power Amplifier Using MEMS Switches For Mobile Terminals-" NTT DoCoMo Technical Journal, vol. 8, No. 3, Oct. 2006, pp. 24-31.

Atsushi Fukuda, et al. "Novel 900 MHz/1.9 GHz Dual-Mode Power Amplifier Employing MEMS Switches for Optimum Matching" IEEE Microwave and Wireless Components Letters, vol. 14, No. 3, Mar. 2004, pp. 121-123.

* cited by examiner

BIAS CIRCUIT

BACKGROUND OF THE INVENTION

1. Field of the Invention

The present invention relates to a bias circuit used for an amplifier and so on.

2. Description of the Related Art

A bias circuit in an amplifier application, for example, is connected to an AC circuit including an amplifying element, which is an active element, and supplies a DC voltage to the amplifying element without affecting transmission of a signal at a frequency to be amplified.

FIG. 16 shows an example of a conventional bias circuit for an amplifier used in a device such as a radio device. The bias circuit 100p shown in FIG. 16 supplies a DC voltage to a field-effect transistor 180, which is an example of the active element that performs amplification. The bias circuit 100p includes a transmission line 181 one end of which is connected to the gate terminal 185 of a field-effect transistor 180 to which a DC voltage is applied, a capacitor 182 one end of which is connected to the other end of the transmission line 181 and the other end is grounded, a choke coil 183, which is a DC circuit, one end of which is connected to a connection point 186 between the transmission line 181 and the capacitor 182, and a DC power supply 184 which is connected to the other end of the choke coil 183 and generates a constant DC voltage with respect to a ground potential. The line length of the transmission line 181 is one-quarter of the wavelength of an operating frequency.

In the following description, the field-effect transistor is referred to as the FFT and the wavelength of a frequency is denoted by λ.

The capacitance of the capacitor 182 is chosen such that the impedance of the capacitor 182 becomes negligibly small at the frequency of an AC signal with a wavelength λ. As a result, the transmission line 181 corresponds to an end short-circuited transmission line for the AC signal with the wavelength λ. Because the transmission line 181 is ¼-wavelength long as stated above, the impedance of the bias circuit 100p viewed from the gate terminal 185 of the FET 180 in the bias circuit 100p shown in FIG. 16 can be considered to be infinite at the AC signal frequency with wavelength λ. The DC power supply 184 is connected in terms of direct current to the gate terminal 185 of the FET 180 through the choke coil 183 and the transmission line 181. These elements constitute a DC network which applies a DC voltage to the gate terminal 185 of the FET 180. As a result, the FET 180 operates on a DC voltage from the DC power supply 184 as a bias voltage. Such a bias circuit is disclosed in Japanese Patent Laid-Open Application No. 11-150431, for example, which is laid open in 1999. (Patent literature 1)

As the variety of services provided through radio communications increases, dual- or multi-band radio devices capable of handling the information in multiple frequency bands are demanded in these years. In order to enable a radio device to be used under multiple frequency bands, a radio circuit such as an amplifier must be designed to operate at each of multiple frequency bands. One of the demands associated with designing radio circuits such as amplifiers for multiple frequency bands is to enable a bias circuit to operate at each of multiple frequency bands.

For example, Japanese Patent Laid-Open Application No. 2003-101440 (referred to as Patent Literature 2, hereinafter) discloses a technology of using multiple conventional bias circuits to enable an amplifier to operate at each of multiple frequency bands.

Another technology is disclosed in Japanese Patent Laid-Open Application No. 2001-267864 (referred to as Patent Literature 3, hereinafter). The technology employs a configuration where the bias voltage of an active element adapts to working frequency bands, and thereby enables an amplifier to operate at each of multiple frequency bands by changing matching condition on the basis of significantly changing the input and output impedances of the amplifier.

SUMMARY OF THE INVENTION

A bias circuit according to the present invention comprises: a first reactance means one end of which is connected to the alternating-current circuit; a capacitive means one end of which is grounded; a direct-current circuit part capable of supplying a direct-current voltage; one or more second reactance means; and a reactance providing means capable of providing a reactance; wherein each of the second reactance means is cascade-connected between the other end of the first reactance means and the other end of the capacitive means; the direct-current circuit part is connected to a connection point (the connection point R) between the capacitive means and the second reactance means which is connected to the capacitive means; the connection point R is grounded in terms of alternating current; and the reactance providing means is capable of providing a reactance to a position (the open position) from which an impedance as viewed toward said capacitive means is sufficiently large between the other end of said first reactance means and the other end of said capacitive means in accordance with a frequency (the alternating-current frequency) of an alternating-current signal passing through the alternating-current circuit so that an impedance as viewed from a connection point (the bias point) between the alternating-current circuit and the first reactance means is sufficiently large.

DETAILED DESCRIPTION

Embodiments of the present invention will be described with reference to the accompanying drawings. Like or corresponding elements are given like reference symbols throughout the drawings and repeated description thereof will be omitted.

First Embodiment

Figure 1:
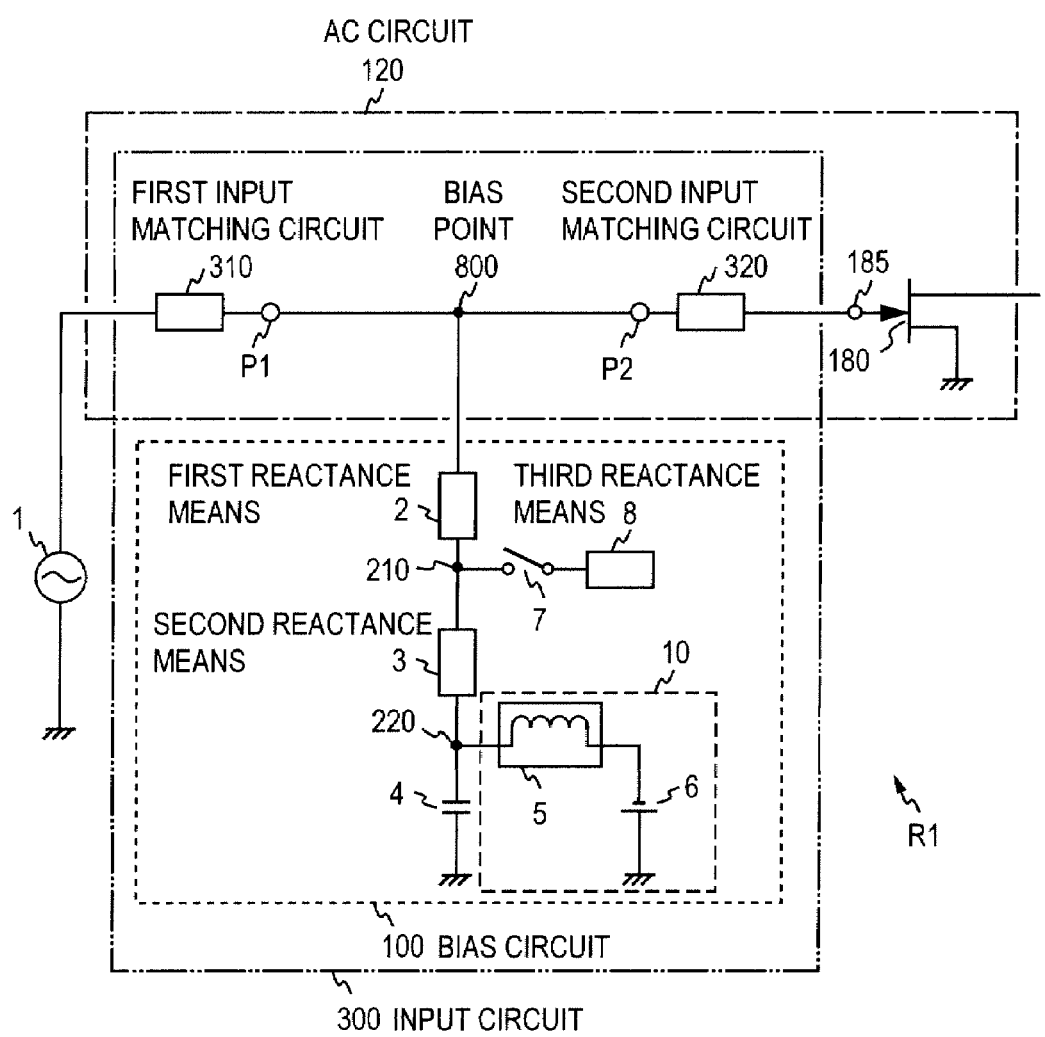
FIG. 1 is a block diagram showing a bias circuit according to a first embodiment of the present invention.

FIG. 1 shows a bias circuit according to a first embodiment of the present invention. The first embodiment is an example of the bias circuit which is used on the input terminal side of an amplifier.

In the first embodiment, the bias circuit used for a dual-band amplifier circuit R1 is illustrated for facilitating understanding of the bias circuit according to the present invention.

The amplification device may be such as a transistor, FET, MOSFET (Metal Oxide Semiconductor FET), or TFT (Thin Film Transistor). While an n-channel junction FET 180 is shown as the amplification device in each figure, it is not intended to limit the amplification device to an n-channel junction FET 180 but is only illustrative of the amplification device.

An input circuit 300 of the amplifier circuit R1 shown in FIG. 1 includes a first input matching circuit 310, a second input matching circuit 320, and the bias circuit 100. An AC circuit 120 includes the first input matching circuit 310, the second input matching circuit 320, and the FET 180. An AC signal source 1 is connected to the input end of the input circuit 300 of the amplifier circuit R1 shown in FIG. 1. An AC signal provided from the AC signal source 1 is transmitted to the FET 180. The first input matching circuit 310 and the second input matching circuit 320 here are matching circuits for the FET 180 at the frequency (AC frequency) of the AC signal provided from the AC signal source 1.

The bias circuit 100 includes a first reactance means 2 one end of which is connected to a connection point 800 between the first input matching circuit 310 and the second input matching circuit 320 in the AC circuit 120, a second reactance means 3 one end of which is connected to the other end of the first reactance means 2, a capacitive means 4 one end of which is connected to the other end of the second reactance means 3 and the other end is grounded, a direct-current circuit part 10 comprising a DC circuit 5 and a DC power supply 6. The reactance means is a circuit component that presents a reactance to the AC circuit. The reactance means may be a distributed-constant element such as a transmission line, or a lumped-parameter element such as a capacitor or an inductor, or a circuit consisting of multiple such elements. The capacitive means is a circuit component that has the capability of storing charge and may be a capacitor, for example. The capacitor is not limited to one that has a fixed capacitance. Any capacitor may be used that is capable of causing a second connection point 220, which will be described later, to be grounded in terms of alternating current. For example, a capacitor having a variable capacitance may be used by fixing its capacitance to a certain value to achieve the object described above. It should be noted that a configuration according to a sixth embodiment, which will be described later, can be applied to even such cases.

The DC power supply 6 that generates a constant DC voltage with respect to the ground is connected to the second connection point 220 between the second reactance means 3 and the capacitive means 4 via the DC circuit 5. The DC circuit 5 may be an inductive element that has an inductance as large as possible at the frequency of an AC signal, for example. Alternatively, an inductive element having a small inductance may be used if the impedance at the second connection point 220 is sufficiently small at the frequency of an AC signal. Examples of such inductive elements include a choke coil. The inductance value and material of the inductive element are design parameters that are determined in consideration of the section where the element is to be used, frequency, and current capacity. The purpose of inserting the DC circuit 5 is to prevent an AC signal provided from the AC signal source 1 from affecting the DC power supply 6. Accordingly, the DC circuit 5 is not limited to an inductive element but may be any element that can achieve that object. For example, it may be a low-pass filter. Furthermore, the DC circuit 5 may be implemented as a single discrete device or as a circuit.

A third reactance means 8 is connected to a first connection point 210 between the first reactance means 2 and the second reactance means 3 via a switch 7. The term "switch" as used herein, including the switch 7, is not limited to a contact switch. For example, a switch may be a so-called switching element that has the function of switching a circuit, using such as a diode, transistor, and a MOS element, without providing a contact in a network. Examples include MEMS (Micro-Electro Mechanical Systems) switches and switching diodes.

In the following description, the connection point 800 interconnecting the bias circuit 100, the first input matching circuit 310, and the second input matching circuit 320 is referred to as the bias point. The bias circuit 100 must be connected to the gate terminal 185 of the FET 180 in terms of direct current. Therefore, the second input matching circuit 320 is a circuit capable of applying a DC voltage to the gate terminal 185 of the FET 180.

The purpose of providing the first input matching circuit 310 and the second input matching circuit 320 is to establish impedance matching between the AC signal source 1 and the FET 180 for an input AC signal of an operating frequency. Depending on design requirements, the first input matching circuit 310 or the second input matching circuit 320 alone may be used. Examples of matching circuits capable of operating at each of multiple frequency bands include multiband matching circuits disclosed in Non Patent literatures 1 and 2 listed below.

Non Patent literature 1: Atsushi Fukuda, Hiroshi Okazaki, and Shoichi Narahashi, "Power Amplifier for Broadband Applications Beyond the Third-Generation-Multi-Band—High-efficiency Power Amplifier Using MEMS Switches for Mobile Terminals—," NTT DoCoMo Technical Journal, Vol. 14, No. 3, pp. 25-31, October 2006

Non Patent Literature 2: Atsushi Fukuda, Hiroshi Okazaki, Tetsuo Hirota and Yasushi Yamao, "Novel 900 MHz/1.9 GHz Dual-Mode Power Amplifier Employing MEMS Switches for Optimum Matching," IEEE Microwave and Wireless Components letters, Vol. 14, No. 3, March 2004

Features of the configuration of the illustrative bias circuit 100 as the first embodiment will be described with respect to a design for a dual-band application.

The impedance of the first reactance means 2 at an m-th frequency $f_m$ is denoted by $Z_{1m}$, the impedance of the second reactance means 3 is denoted by $Z_{2m}$, the impedance of the third reactance means 8 is denoted by $Z_{3m}$, and the impedance of the capacitive means 4 is denoted by $Z_{cm}$. In the first embodiment, m=1, 2.

It is assumed in the following description that the first frequency $f_1$ is lower than the second frequency $f_2$. That is, $f_1 < f_2$.

The switch 7 in the bias circuit 100 is placed in the off state (non-conducting state) at the first frequency $f_1$ and in the on state (conducting state) at the second frequency $f_2$.

The bias circuit 100 at the first frequency $f_1$ will be described first.

It is assumed here that the impedance of the bias circuit 100 viewed from the bias point 800 on the signal path of an AC signal provided from the AC signal source 1 at the first frequency $f_1$ is sufficiently large. That is, the total impedance $Z_{11} + Z_{21} + Z_{c1}$ of the bias circuit 100 at the first frequency $f_1$ viewed from the bias point 800 while the switch 7 is in the off state is sufficiently large.

In other words, the bias point 800 is open-circuited in terms of alternating current at the first frequency $f_1$. An expression "a certain part is open-circuited in terms of alternating current" here means that the impedance as viewed from the part toward the capacitive means 4 is sufficiently large. In the following description, the expression is described simply as "a certain part is open-circuited". On the other hand, when the impedance is sufficiently small, it will be described simply as a certain part is short-circuited.

When the bias point 800 is open-circuited at the first frequency $f_1$, the bias circuit 100 including the first reactance means 2, the second reactance means 3, the DC circuit 5 and the DC power supply 6 can be considered independently of the AC circuit at the first frequency $f_1$ in terms of alternating current. That is, the influence of the bias circuit 100 on AC signal transmission can be ignored.

From this viewpoint, the words "impedance is sufficiently large" can be construed to mean that the impedance is large enough that the DC circuit 5 and the DC power supply 6 can be considered independently of the AC circuit at the frequency of the AC signal in terms of alternating current. A specific value of the impedance is determined mainly on the basis of the degree required by the design. The same applies to the words "the impedance is sufficiently large" used in the following description.

The DC circuit 5 may be implemented by a transmission line, for example. In that case, the DC circuit 5 is implemented by a transmission line made of a conductive material such as Au, formed on a substrate made of a dielectric such as alumina. If the first reactance means 2 and the second reactance means 3 are implemented by transmission lines, the DC power supply 6 is connected to the AC circuit 120 via transmission lines with the resistivity of the conductive material because the DC power supply 6 is connected to the second reactance means 3 via the DC circuit 5 composed of a transmission line. Accordingly, the DC power supply 6 can provide a DC voltage to the bias point with a considerably low resistivity in terms of direct current.

The capacitance of the capacitive means 4 is set to a value as large as possible so that the impedance (capacitive reactance) of the capacitive means 4 will be sufficiently small for a high design-target frequency, for example a frequency of the order of GHz. If there is a large area for installing the capacitive means 4, it is desirable that the capacitance of the capacitive means 4 be set to a sufficiently large value such as 100 pF (picofarads). However, depending on operating frequencies, lower capacitances may suffice. Thus, the second connection point 220 between the second reactance means 3 and the capacitive means 4 is short-circuited.

Any circuit configuration of the first reactance means 2 and the second reactance means 3 may be used in which the bias point 800 is open-circuited and the second connection point 220 is short-circuited. If the first reactance means 2 and the second reactance means 3 of the bias circuit shown in FIG. 1 are implemented by transmission lines, the total of the electrical lengths of the transmission lines of the first reactance means 2 and the second reactance means 3 may be chosen to be 90 degrees at the first frequency $f_1$.

It is assumed in the following description that the capacitance of the capacitive means 4 is sufficiently large, that is, the capacitance is such that the impedance of the capacitive means 4 is sufficiently small at the frequency of an AC signal.

The sum of the electrical lengths of the first reactance means 2 and the second reactance means 3 at the first frequency $f_1$, namely 90 degrees, is equivalent to a line length (physical length) of $\lambda_1/4$, where $\lambda_1$ is the wavelength of the first frequency $f_1$. In the following description, a line length is denoted by $\lambda$ with a numerical subscript indicating frequency. The line length is equal to the line length of the transmission line 181 in the conventional bias circuit 100$p$ shown in FIG. 16.

Premised on the foregoing description of the bias circuit 100 at the first frequency $f_1$, the bias circuit 100 at the second frequency $f_2$ will be described below.

At the second frequency $f_2$, the impedance of the bias circuit 100 viewed from the bias point 800 on the signal path of an AC signal provided from the AC signal source 1 is not sufficiently large. That is, when the switch 7 is in the off state, the total impedance $Z_{12} + Z_{22} + Z_{c2}$ at the second frequency $f_2$ ($f_1 < f_2$) does not become sufficiently large unless the second frequency $f_2$ is an odd multiple of the first frequency $f_1$. Therefore, the bias circuit 100 including the first reactance means 2, the second reactance means 3, the DC circuit 5 and the DC power supply 6 cannot be prescinded from the AC circuit 120 in terms of alternating current. Hence, the AC signal at the second frequency $f_2$ is affected by the bias circuit 100.

Figure 2:
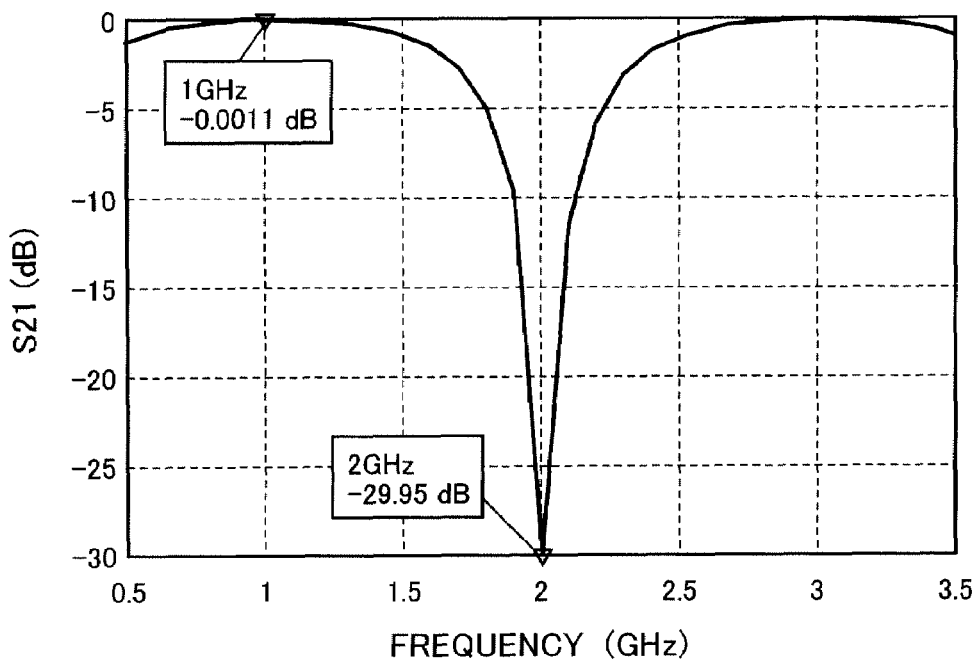
FIG. 2 is a graph showing the result of a simulation of a pass characteristics (S21) at a first frequency $f_1$ in the bias circuit according to the first embodiment.

For example, FIG. 2 shows the result of a simulation of the frequency response of pass characteristics (S21) of the bias circuit 100 when the switch 7 is in the off state, where the first frequency $f_1$ is 1 GHz and the second frequency $f_2$ is 2 GHz. Shown in FIG. 2 is the result of the simulation of the pass characteristics (S21) calculated when a port P1 and a port P2 are connected to a 50-ohm system, where the port P1 is the input terminal of the bias circuit 100 shown in FIG. 1 and the port P2 is the output terminal of the bias circuit 100. As shown in FIG. 2, the signal of 1 GHz passed with little loss whereas the signal of 2 GHz passed with a loss of nearly 30 dB. The calculation in the simulation was performed with the assumption that the switch 7 is an ideal switch that has zero loss in the on state and infinite isolation in the off state. While a case where the ideal switch is used will be described below, a frequency response relating to the amplitude and phase of the switch must be considered in the actual design, as well as characteristics of other components.

In an example where the first reactance means 2 and the second reactance means 3 of the bias circuit 100 are implemented by transmission lines in such a manner that the sum of the electrical lengths is 90 degrees at the first frequency $f_1$, the position where is open-circuited at the second frequency $f_2$ when the second connection point 220 is short-circuited while the switch 7 is in the off state will be between the bias point 800 and the second connection point 220, under condition of $f_1 < f_2$. The first connection point 210 is provided at the open-circuited position, which is one of the features of the bias circuit of the present invention. In other words, the first connection point 210 to which the switch 7 connects is at a position such that the impedance is sufficiently large at the second frequency $f_2$, as viewed from the first connection point 210 toward the second reactance means 3. Here, the line length of the second reactance means 3, which is the transmission line between the first connection point 210 and the second connection point 220, may be $\lambda_2/4$. In this case, the line length of the reactance means 2 will be $(\lambda_1/4 - \lambda_2/4)$.

As has been described above, the total impedance $Z_{12} + Z_{22} + Z_{c2}$ at the second frequency $f_2$ ($f_1 < f_2$) when the switch 7 is in the off state is not sufficiently large unless the second frequency $f_2$ is an odd multiple of the first frequency $f_1$. However, the impedance at the second frequency $f_2$ as viewed from the first connection point 210 toward the second reactance means 3 is sufficiently large. That is, $Z_{22} + Z_{c2}$ is sufficiently large.

Therefore, the switch 7 is turned on at the second frequency $f_2$ to effect the operation of the bias circuit 100. Here, the total impedance $Z_{12} + Z_{32}$ of the first reactance means 2 and the third reactance means 8 viewed from the bias point 800 at the second frequency $f_2$ is sufficiently large.

That is, the impedance $Z_{32}$ of the third reactance means 8 is set to a value such that the total impedance $Z_{12} + Z_{32}$ at the second frequency $f_2$, which is the impedance as viewed from the bias point 800 toward the bias circuit 100 while the switch 7 is in the on state, is sufficiently large.

Here, the bias circuit 100 including the first reactance means 2, the second reactance means 3, the DC circuit 5 and the DC power supply 6 can be prescinded from the AC circuit at the second frequency $f_2$ in terms of alternating current.

If the third reactance means 8 is implemented by an open-circuited transmission line, the sum of the electrical lengths of the first reactance means 2 and the third reactance means 8 may be designed to be 180 degrees, for example, at the second frequency $f_2$. In this case, with the assumption of the design described above, the line length of the third reactance means 8 will be $(2p \times \lambda_2/4 - (\lambda_1/4 - \lambda_2/4))$, where p is a positive integer and the symbol × denotes multiplication.

Figure 3:
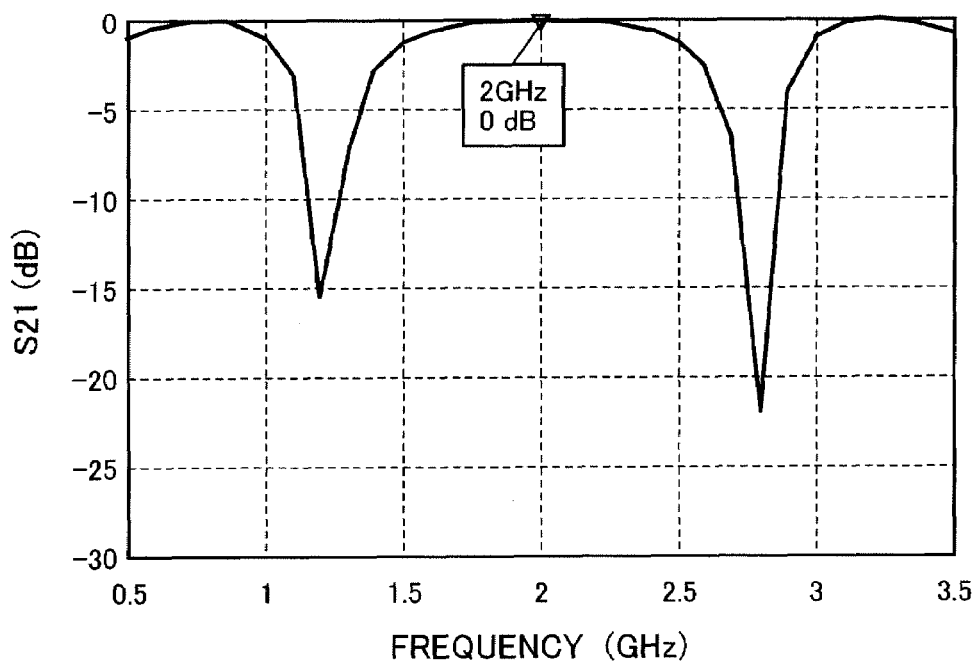
FIG. 3 is a graph showing the result of a simulation of a pass characteristics (S21) at a second frequency $f_2$ in the bias circuit according to the first embodiment.

For example, if the first frequency $f_1$ is 1 GHz and the second frequency $f_2$ is 2 GHz, then $2\lambda_2 = \lambda_1$. Therefore, the line length of the first reactance means 2 may be chosen to be $\lambda_2/4$ and the line length of the third reactance means 8 may chosen to be $\lambda_2/4$. Here, the sum of the line lengths of the first reactance means 2 and the second reactance means 3 is $\lambda_2/4 + \lambda_2/4 = \lambda_2/2 = \lambda_1/4$. FIG. 3 shows the frequency response of pass characteristics (S21) of the bias circuit 100 when the switch is in the on state. As shown in FIG. 3, the bias circuit 100 allowed a signal of 2 GHz to pass through with little loss.

As has been described, the bias circuit 100 including the first reactance means 2, the second reactance means 3, the DC circuit 5 and the DC power supply 6 can be prescinded from the AC circuit at two different frequencies in terms of alternating current by switching the state of the switch 7 (between the on and off states).

The dual-band bias circuit 100 has been described above. Consider a design that requires two different frequencies, 1 GHz and 1.2 GHz. If a signal loss of up to approximately 3 dB is to be allowed in the bias circuit 100 on the basis of the frequency response of pass characteristics (S21) of the bias circuit 100 shown in FIG. 2, the bias circuit 100p having a conventional configuration can sufficiently achieve the design target. However, the frequency responses of pass characteristics (S21) of conventional bias circuits in general do not necessarily show low-loss in a wide band as shown in FIG. 2. In addition, conventional bias circuits do not necessarily achieve the purpose of operating at each of not only adjacent two frequency bands but also two arbitrary frequency bands. In contrast, the bias circuit 100 according to the first embodiment is capable of operating at each of two bands regardless of the distance between the two bands by setting a position of the first connecting part 210 and switching the state of the switch 7. The effect described above is applied to not only the dual-band bias circuit 100 but also bias circuits in general according to the present invention.

Furthermore, if the first frequency $f_1$ is 1 GHz and the second frequency $f_2$ is 4 GHz, for example, the first connection point 210 to which the switch 7 connects is provided at a position such that the impedance at the second frequency $f_2$ as viewed from the connection point 210 toward the second reactance means 3 is sufficiently large. In this case, the line length of the second reactance means 3 can be $\lambda_2/4$ or $3\lambda_2/4$, for example. Any of these line lengths can be selected at the design phase. If the line length of the second reactance means 3 is chosen to be $3\lambda_2/4$, the line length of the first reactance means 2 may be chosen to be $\lambda_2/4 (= \lambda_1/4 - 3\lambda_2/4)$.

When the line length of the second reactance means 3 can take on multiple design values in this way, any of the line lengths can be selected. In other words, the position of the first connection point 210 can be set in accordance with a frequency band required by a design.

The reactance means is not limited to a transmission line; it may be implemented by a lumped-parameter element. Especially the third reactance means 8 can be easily implemented by a lumped-parameter element because the third reactance means 8 is used only at a single frequency. Also, the bias circuit can be reduced in size by using lumped-parameter elements.

A bias circuit having the same configuration may also be provided on the output terminal side of the FET 180. Basic operation of the bias circuit is the same as that of the bias circuit provided on the input terminal side of the FET 180 and therefore the description of which will be omitted.

Second Embodiment

Figure 4:
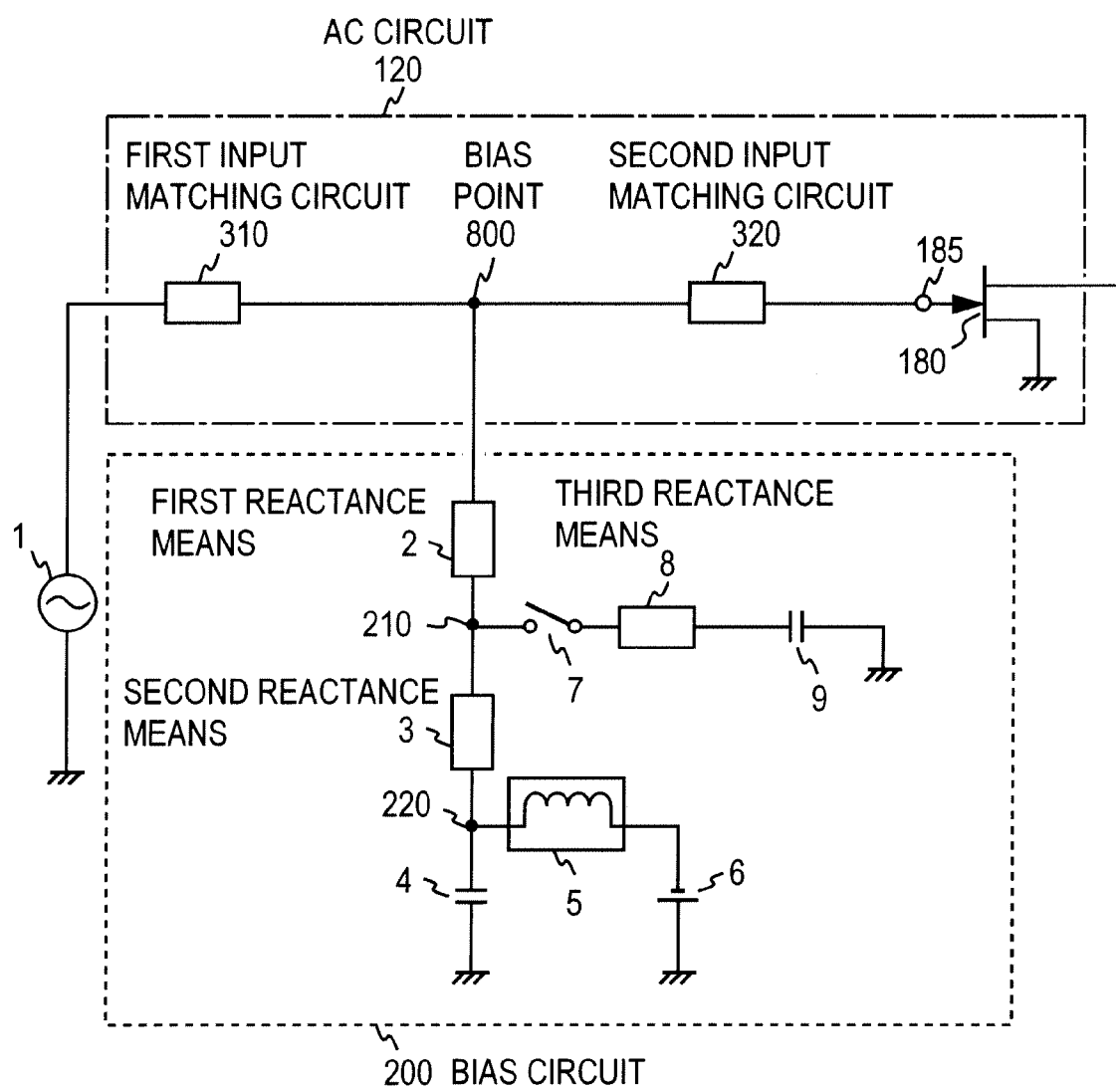
FIG. 4 is a block diagram showing a bias circuit according to a second embodiment of the present invention.

FIG. 4 shows a bias circuit 200 according to a second embodiment of the present invention. In the second embodiment, the other end of the third reactance means 8 (the end to which the switch 7 is not connected) is grounded via a second capacitive means 9.

As with the bias circuit 100 in the first embodiment, the bias circuit 200 including the first reactance means 2, the second reactance means 3, the DC circuit 5 and the DC power supply 6 can be prescinded from the AC circuit at each of two frequencies in terms of alternating current by switching the state of the switch 7. Thus, a bias circuit capable of operating at each of two bands can be implemented.

If the first reactance means 2, the second reactance means 3, and the third reactance means 8 are implemented by transmission lines, the line length of the third reactance means 8 can be chosen to be $((2p-1) \times \lambda_2/4 - (\lambda_1/4 - \lambda_2/4))$, where p is a positive integer.

In the second embodiment, the line length of the third reactance means 8 can be reduced in some cases by a short circuit in terms of alternating current of the other end of the third reactance means 8.

For example, if a first frequency $f_1$ is 1 GHz and a second frequency $f_2$ is 3.8 GHz and the line length of the second reactance means 3 in the second embodiment is chosen to be $3\lambda_2/4$, the line length of the third reactance means 8 can be only approximately 20 degrees in terms of electrical length at the second frequency $f_2$. In the first embodiment, on the other hand, the line length of the third reactance means 8 at the second frequency $f_2$ needs to be approximately 103 degrees.

Figure 5:
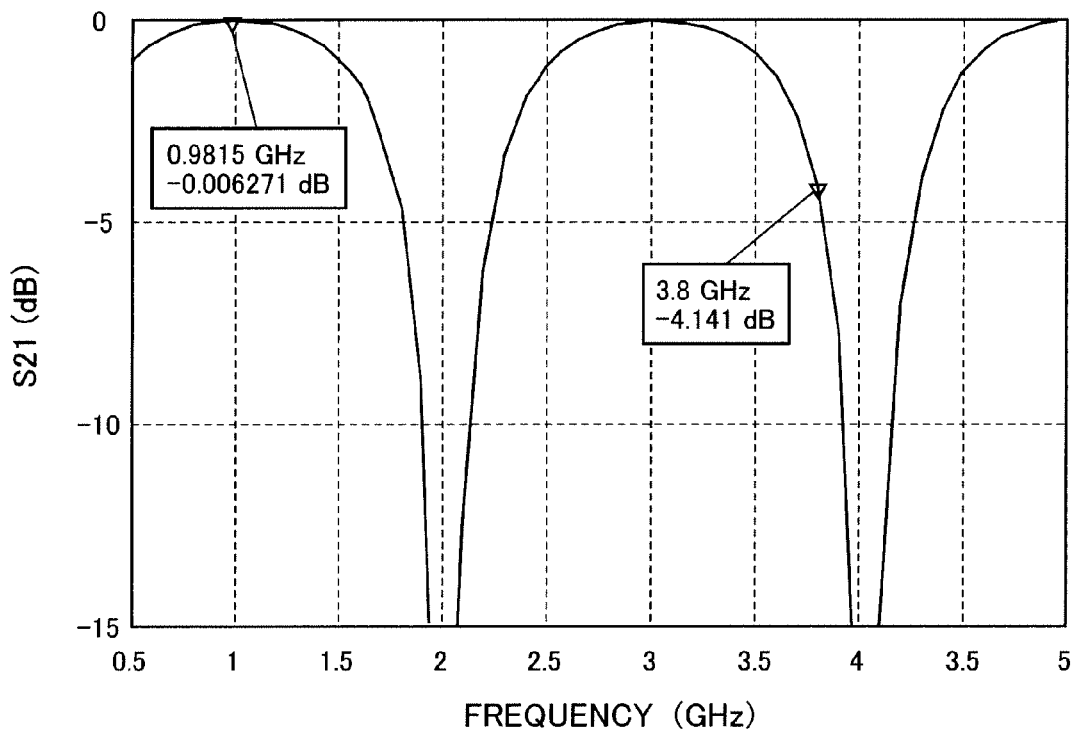
FIG. 5 is a graph showing the result of a simulation of a pass characteristics (S21) at a first frequency $f_1$ in the bias circuit according to the second embodiment.
Figure 6:
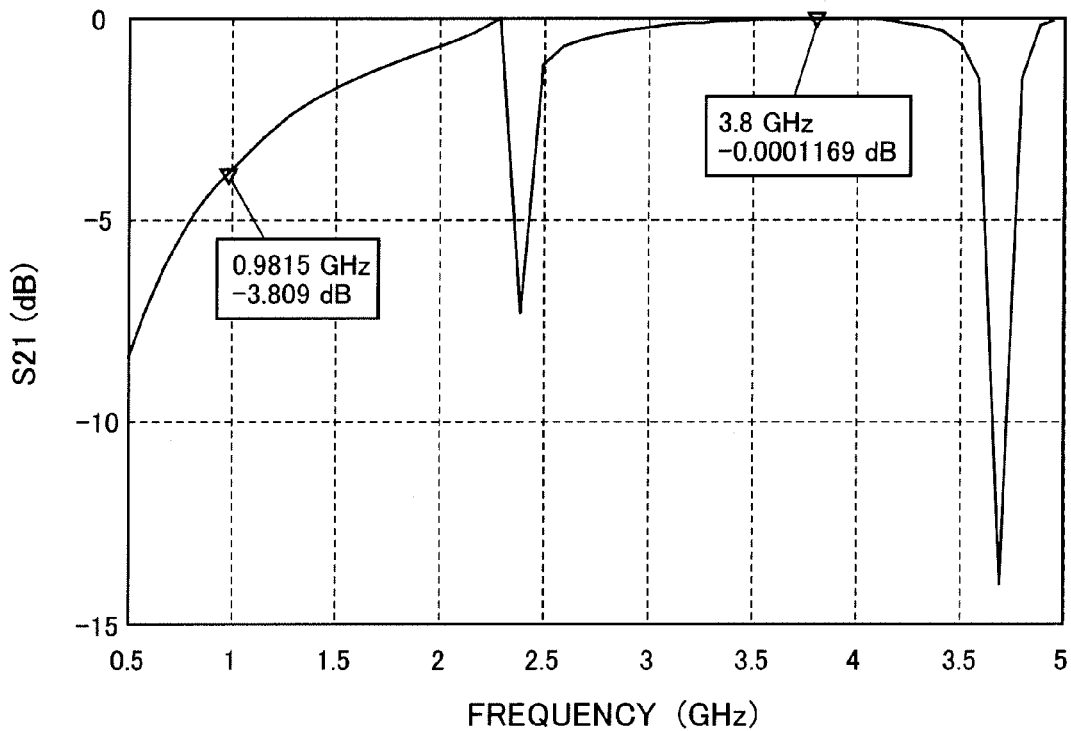
FIG. 6 is a graph showing the result of a simulation of a pass characteristics (S21) at a second frequency $f_2$ in the bias circuit according to the second embodiment.

FIG. 5 shows the result of a simulation of the frequency response of the pass characteristics (S21) of the bias circuit 200 when the switch 7 is in the off state, where the first frequency $f_1$ is 1 GHz and the second frequency $f_2$ is 3.8 GHz. FIG. 6 shows the result of a simulation of the frequency response of the pass characteristics (S21) of the bias circuit 200 when the switch is in the on state. Shown in FIGS. 5 and 6 are the results of simulations of the pass characteristics (S21) calculated for a case where the port P1 and the port P2 are connected to a 50-ohm system, where the port P1 is the input terminal of the bias circuit 200 shown in FIG. 4 and the port P2 is the output terminal of the bias circuit 200. As shown in FIG. 5, the signal of 1 GHz passed with little loss through the bias circuit 200 in which the switch 7 is in the off state whereas the signal of 3.8 GHz passed with a loss. On the other hand, the signal of 3.8 GHz passed with little loss through the bias circuit 200 in which the switch 7 is in the on state.

While the bias circuit operates at each of two frequencies in the first and second embodiments, the bias circuit operates at more frequencies in third, fourth, and fifth embodiments based on a similar idea.

Third Embodiment

In the third embodiment, the reactance of the third reactance means 8 is changed in accordance with an AC frequency so that impedance as viewed from the bias point 800 toward a bias circuit becomes sufficiently large when the first connection point 210 is open-circuited at multiple AC frequencies such as odd multiples of a first AC frequency $f_1$. A configuration of the bias circuit in the third embodiment enables adjustment of the reactance of the third reactance means 8 affected by a design value of "sufficiently large impedance".

Figure 7:
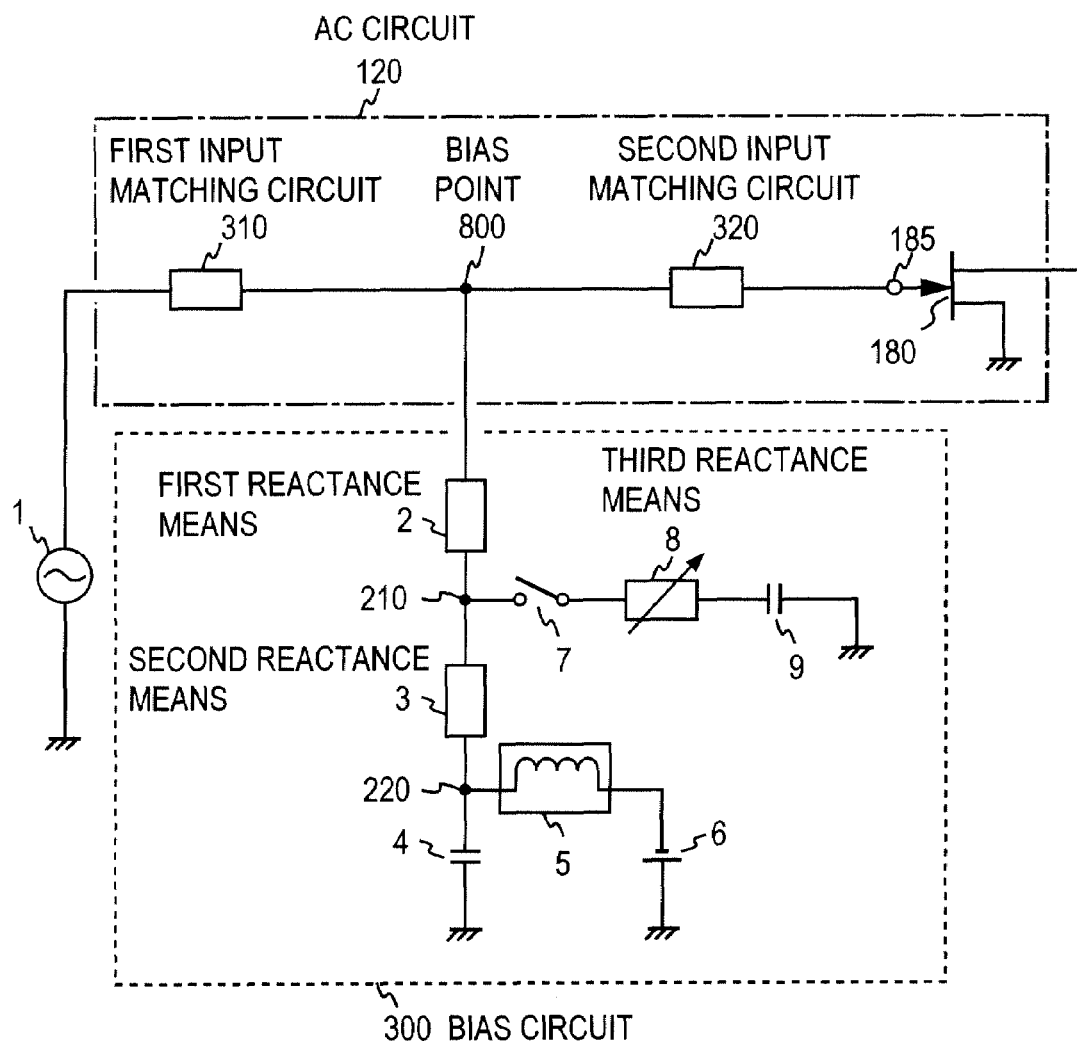
FIG. 7 is a block diagram showing a bias circuit according to a third embodiment of the present invention.

FIG. 7 shows the third embodiment of the present invention. The bias circuit 300 according to the third embodiment uses a variable reactance means capable of changing reactance values, in place of the third reactance means 8 in the bias circuit 200 in the second embodiment. The variable reactance means may be a variable capacitor capable of changing its capacitance of which. By using the third reactance means 8 whose reactance can be changed among q reactance values, the bias circuit 300 capable of operating at each of q+1 bands can be implemented. Here, q is an integer greater than or equal to 2.

It should be noted that variable reactance means whose reactance value can be changed may also be used as the third reactance means 8 in the bias circuit 100 in the first embodiment.

Figure 8:
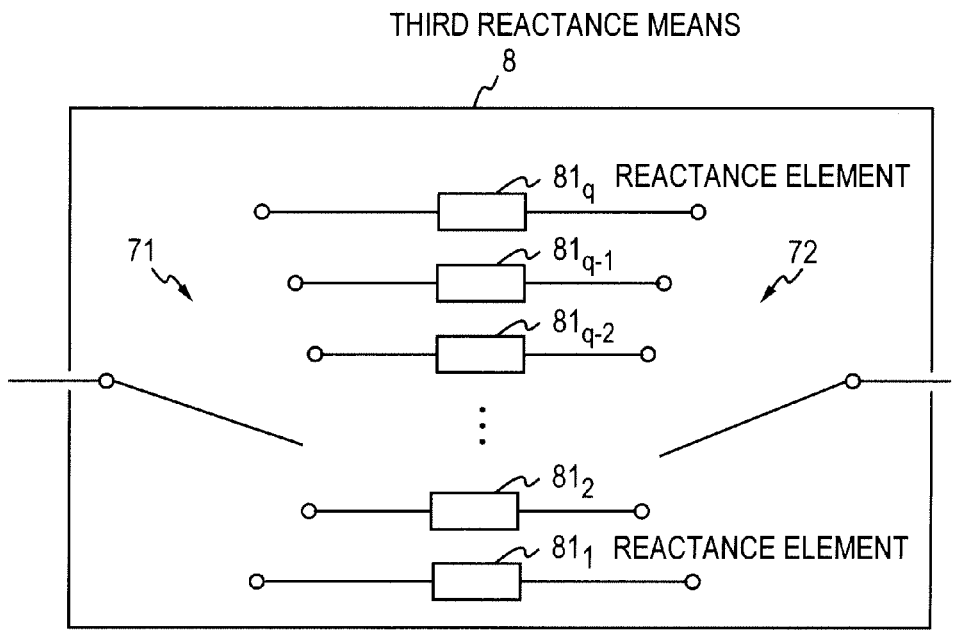
FIG. 8 is a block diagram showing an exemplary configuration of third reactance means 8 in the bias circuit according to the third embodiment.

As shown in FIG. 8, the third reactance means 8 may be implemented by one-input q-output switches 71 and 72, which are selector switches, and q reactance elements $81_1, \ldots, 81_q$ capable of being connected to the selector switches. In this configuration of the embodiment, the q reactance elements $81_1, \ldots, 81_q$ are arranged in parallel. One end of the switch 71 is connected to the first connection point 210 and one end of switch 72 is connected to the second capacitive means 9. The other ends of the switch 71 and the switch 72 are switched to select the same reactance element. Thus, q reactance values can be obtained by switching the states of the switches 71 and 72.

While two selector switches are used in this example because the example is based on the second embodiment, only the switch 71 is required if based on the first embodiment. That is, it is not an absolute technical necessity that second capacitive means is capable of being connected to each reactance element. Furthermore, as the variation of the configuration shown in FIG. 8, each of the other ends (ends that are not connected to the switch 71) of some or all of q reactance elements $81_1, \ldots, 81_q$ may be connected to a second capacitive means without providing the switch 72, although not necessarily effective in reducing the size of the entire circuit. In short, at least one reactance element may be capable of being connected to a second capacitive means. The switch 71 may be implemented as a selector switch that can be placed in the state in which the switch 71 is not connected to any of the reactance elements.

Figure 9:
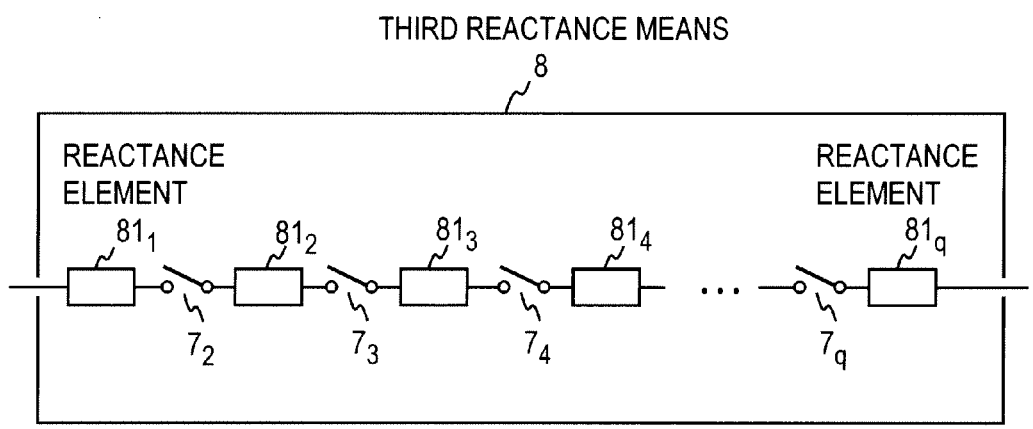
FIG. 9 is a block diagram showing an exemplary configuration of third reactance means 8 in the bias circuit according to the third embodiment.
Figure 10:
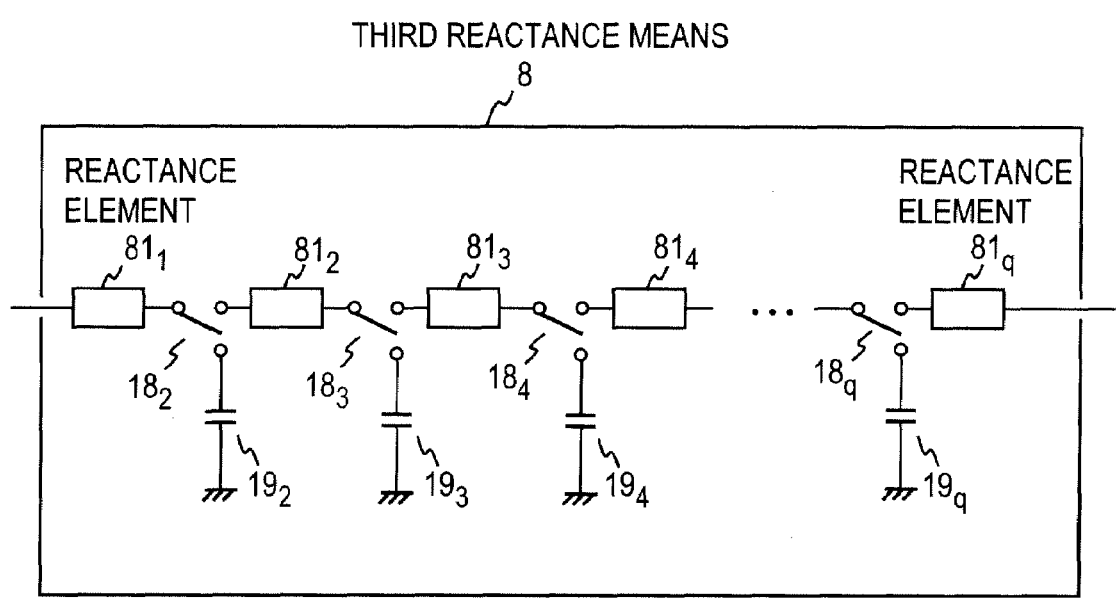
FIG. 10 is a block diagram showing an exemplary configuration of third reactance means 8 in the bias circuit according to the third embodiment.

In another configuration of the third reactance means 8, a combination of switches and reactance elements may be used as shown in FIG. 9 or 10. In the configuration shown in FIG. 9, q reactance elements $81_1, \ldots, 81_q$ and q−1 switches $7_2, \ldots, 7_q$ are alternately cascade-connected. That is, one end of the reactance element $81_1$ located at one end of the cascade-connected reactance elements is connected to the switch 7 and the other end (the end to which the switch 7 is not connected) of the reactance element $81_1$ is connected to one end of the switch $7_2$. One end of the reactance element $81_x$ is connected to the other end of the switch $7_x$ and the other end of the reactance element $81_x$ is connected to one end of the switch $7_{x+1}$. Here, x=2, 3, ..., q−1. One end of the reactance element $81_q$ at the other end of the cascade-connected reactance elements is connected to the other end of the switch $7_q$ and the other end of the reactance element $81_q$ is connected to the second capacitive means 9. However, it is not an absolute technical necessity that the other end of the reactance element $81_q$ is connected to the second capacitive means 9. In this configuration, the reactance means can be designed so that switches $7_2, \ldots, 7_y$ are turned on and the switch $7_{y+1}$ is turned off with regard to the (y+1)-th frequency $f_{y+1}$. When y=1, the switch $7_2$ is turned off. By switching the states of the switches $7_2, \ldots, 7_q$ in this way, q different reactance values can be provided.

In the configuration of the third reactance means 8 shown in FIG. 10, q reactance elements $81_1, \ldots, 81_q$ and q−1 switches $18_2, \ldots, 18_q$ are alternately cascade-connected. One end of the reactance element $81_1$ located at one end of the cascade-connected reactance elements is connected to the switch 7. One end of the switch $18_x$ is connected to the other end of the reactance element $81_{x-1}$, and the other end of the switch $18_x$ is capable of being connected to any of one end of the reactance element $81_x$ and one end of a second capacitive means $19_x$. Here, x=1, 2, 3, ..., q. Because this configuration is based on the second embodiment, the other end of the reactance element $81_q$ is connected to the second capacitive means 9. However, this is not an absolute technical necessity. In this configuration, the switches $18_2, \ldots, 18_y$ are turned on and the other end of the switch $18_{y+1}$ is connected to a second capacitive means $19_{y+1}$ with regard to the (y+1)-th frequency $f_{y+1}$. If y=1, the switch $18_2$ is connected to a second capacitive means $19_2$. Thus, by switching the states of the switches $18_2, \ldots, 18_q$, q different reactance values can be provided.

Fourth Embodiment

Figure 11:
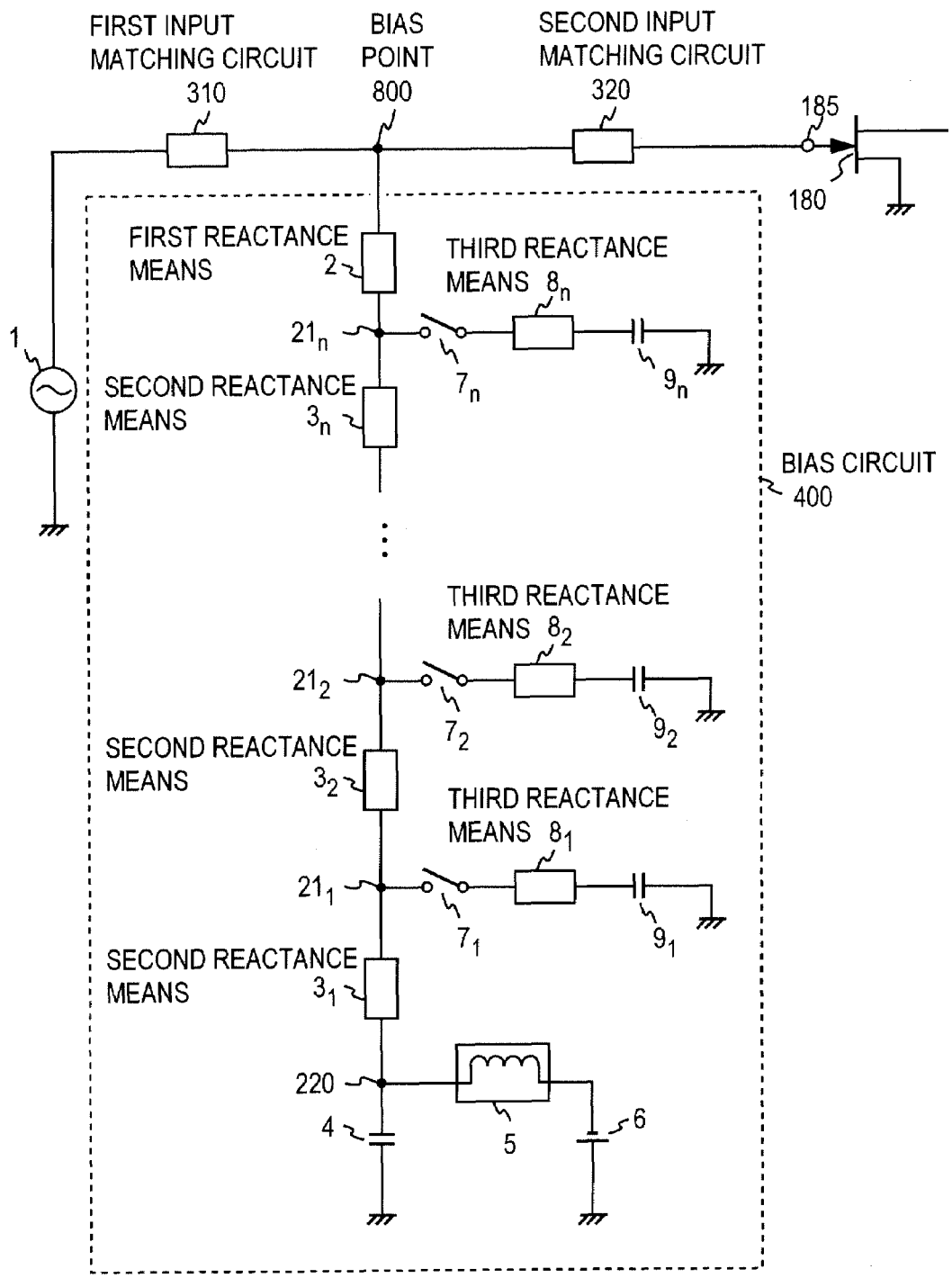
FIG. 11 is a block diagram showing a bias circuit according to a fourth embodiment of the present invention.

FIG. 11 shows a fourth embodiment of the present invention. The fourth embodiment is an expanded version of the second embodiment in which the idea for operating at each of two bands described with respect to the second embodiment is expanded to operate at each of (n+1) bands. In the fourth embodiment, multiple reactance means are provided. A bias circuit 400 shown in FIG. 11 has a circuit part including the first reactance means 2 and n second reactance means $3_1, \ldots, 3_n$ cascade-connected. In particular, one end of the first reactance means 2 is connected to the bias point 800 and the other end of the first reactance means 2 is connected to one end of the second reactance means $3_n$. The other end (the end to which the first reactance means 2 is not connected) of the second reactance means $3_n$ is connected to one end of the second reactance means $3_{n-1}$. The other end (the end to which the second reactance means $3_n$ is not connected) of the second reactance means $3_{n-1}$ is connected to one end of the second reactance means $3_{n-2}$. Such connection is repeated to form a cascade connection and one end of the second reactance means $3_2$ (the end to which second reactance means $3_3$ is not connected) is connected to one end of the second reactance means $3_1$. The other end of the second reactance means $3_1$ is connected to the capacitive means 4.

A third reactance means $8_n$ is connected to a connection point $21_n$ between the first reactance means 2 and the second reactance means $3_n$ via a switch $7_n$. A third reactance means $8_x$ is connected to a connection point $21_x$ between the second reactance means $3_{x+1}$ and the second reactance means $3_x$ via a switch $7_x$. Here, x=n−1, n−2, . . . , 1. Second capacitive means $9_1, \ldots, 9_n$ one end of which is grounded is connected to one end of each third reactance means $8_1, \ldots, 8_n$ (the end to which a switch is not connected). It should be noted that the n second reactance means $3_1, \ldots, 3_n$ are not limited to the same type. For example, some of n second reactance means $3_1, \ldots, 3_n$ may be implemented as transmission lines and the others may be implemented by lumped-parameter elements at designer's discretion.

According to this configuration, the DC circuit 5 and the DC power supply 6 can be prescidned in terms of alternating current with regard to each of at least (n+1) frequencies by switching the state of any of the switches $7_1, \ldots, 7_n$. Thus, the bias circuit 400 is capable of operating at each of at least (n+1) bands. For a bias circuit capable of operating at each of (n+1) bands, for example, if the DC circuit 5 and the DC power supply 6 are to be prescinded in terms of alternating current with regard to the (m+1)-th frequency, only switch $7_m$ is turned on, where m is an integer greater than or equal to 1. At a first frequency, all switches $7_1, \ldots, 7_n$ are tuned off. The position at which the switch $7_m$ is to be connected is chosen to be such that the impedance as viewed from the position toward second reactance means $3_1, \ldots, 3_m$ at the (m+1)-th frequency is sufficiently large. However, turning on one switch does not necessarily mean that the bias circuit 400 capable of operating at each of (n+1) bands is formed. For example, if the first reactance means 2 and the second reactance means $3_1, \ldots, 3_n$ are implemented by transmission lines, similar biasing can also be achieved for an odd multiple of the frequency of an AC signal when only a particular switch is turned on.

The number of switches turned on in the fourth embodiment is not limited to one. When multiple switches, for example the switch $7_x$ and at least one other switch that is farther from the bias point 800 than the switch $7_x$, are turned on, the impedance as viewed from the connection point of the switch $7_x$ toward the capacitive means 4 can be sufficiently large at frequencies other than (n+1) bands, depending on the design values of third reactance means connected to the turned-on switches other than the switch $7_x$. That is, turning on the switch $7_x$ closest to the bias point 800 among the turned on switches means that the impedance as viewed from the connection point $21_x$ to which the switch $7_x$ is connected toward the capacitive means 4 is made sufficiently large; turning on one or more switches appropriately farther from the bias point 800 than the switch $7_x$ means that the design value or values of third reactance means connected to the turned-on switch or switches determine an operating frequency that can be biased accordingly.

While each of one ends of the third reactance means $8_1, \ldots, 8_n$ is grounded via the second capacitive means $9_1, \ldots, 9_n$ in the fourth embodiment, the present invention is not limited to such an embodiment. One end of at least one of the third reactance means $8_1, \ldots, 8_n$ may be connected to one end of a second capacitive means the other end of which is grounded. Alternatively, at least one of the third reactance means $8_1, \ldots, 8_n$ may comprise a transmission line and one end of at least one of the third reactance means that comprises the transmission line may be an open-circuited end of the transmission line.

Fifth Embodiment

Figure 12:
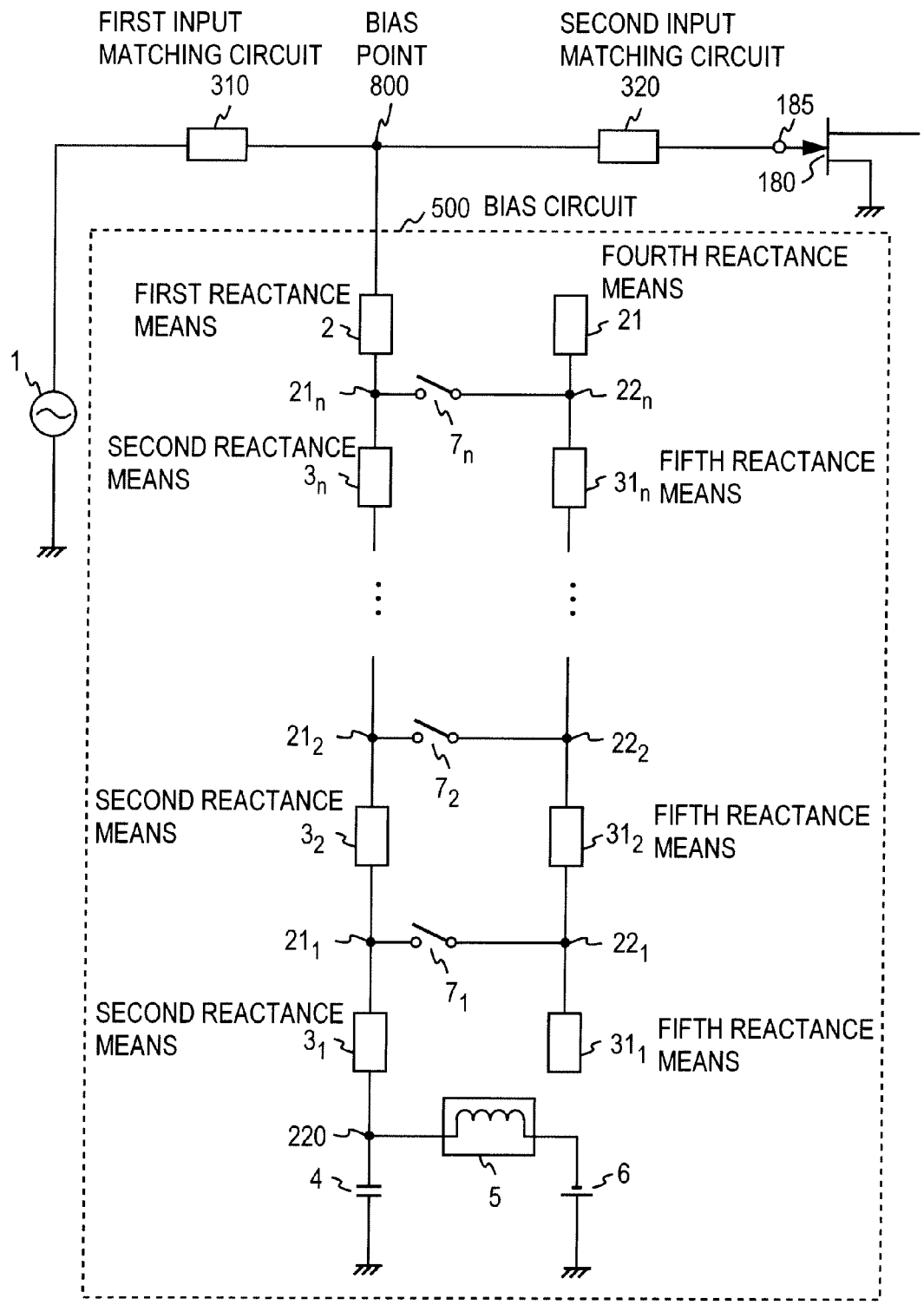
FIG. 12 is a block diagram showing a bias circuit according to a fifth embodiment of the present invention.

FIG. 12 shows a fifth embodiment of the present invention. In the fifth embodiment, multiple reactance means are provided. A bias circuit 500 shown in FIG. 12 has a circuit part in which the first reactance means 2 and n second reactance means $3_1, \ldots, 3_n$ are cascade-connected as in the fourth embodiment. A fourth reactance means 21 and n fifth reactance means $31_1, \ldots, 31_n$ in are also cascade-connected. In particular, one end of the fourth reactance means 21 is open-circuited and the other end is connected to one end of the fifth reactance means $31_n$. The other end of the fifth reactance means $31_n$ (the end to which the fourth reactance means 21 is not connected) is connected to one end of the fifth reactance means $31_{n-1}$. The other end of the fifth reactance means $31_{n-1}$ (the end to which the fifth reactance means $31_n$ is not connected) is connected to one end of the fifth reactance means $31_{n-2}$. Such connection is repeated to form a cascade connection and the other end of the fifth reactance means $31_2$ (the end to which fifth reactance means $31_3$ is not connected) of the fifth reactance means $31_2$ is connected to one end of the fifth reactance means $31_1$. The other end of the fifth reactance means $31_1$ is open-circuited. This is a configuration in which the fourth reactance means 21 and the fifth reactance means $31_1$, for example, comprise a transmission line and each of one ends of the fourth reactance means 21 and the fifth reactance means $31_1$ is the open-circuited end of the transmission line.

The connection point $21_n$ between the first reactance means 2 and the second reactance means $3_n$ is connected with a connection point $22_n$ between the fourth reactance means 21 and the fifth reactance means $31_n$ via the switch $7_n$. The connection point $21_x$ between the second reactance means $3_{x+1}$ and the second reactance means $3_x$ is connected with a connection point $22_x$ between the fifth reactance means $31_{x+1}$ and the fifth reactance means $31_x$ via the switch $7_x$. Here, x=n−1, n−2, . . . , 1. In this way, the second reactance means are associated with the fifth reactance means in a one-to-one correspondence.

It should be noted that n second reactance means $3_1, \ldots, 3_n$ and n fifth reactance means $31_1, \ldots, 31_n$ are not limited to the same types. For example, some of the n second reactance means $31_1, \ldots, 31_n$ and some of n fifth reactance means $31_1, \ldots, 31_n$ may be implemented as transmission lines and the others may be implemented by lumped-parameter elements at designer's discretion.

However, if the operating frequency is a positive integer multiple of a fundamental frequency $f_1$, the fourth reactance means 21 and n fifth reactance means $31_1, \ldots, 31_n$ are made to have the same reactance values as those of their associated first reactance means 2 and second reactance means $3_1, \ldots, 3_n$, respectively. The fourth reactance means 21 is associated with the first reactance means 2 and the fifth reactance means $31_w$ is associated with the second reactance means $3_w$, where $w=1, 2, \ldots, n$.

When the frequency of an AC signal is an odd multiple of a fundamental frequency $f_1$, all switches are turned off. In this case, if the first reactance means 2 and n second reactance means $3_1, \ldots, 3_n$ are transmission lines, the DC circuit 5 and the DC power supply 6 can be prescinded from the AC circuit in terms of alternating current because the bias point 800 can be open-circuited and the second connection point 220 can be short-circuited by means of the total line length of the first reactance means 2 and n second reactance means $3_1, \ldots, 3_n$ designed to be an odd multiple of $\lambda_1/4$.

If the frequency of an AC signal is 2 m times higher than the fundamental frequency $f_1$, only switch $7_m$ is turned on, where m is an integer greater than or equal to 1. Here, the position the switch $7_m$ is connected, that is, the position of the connection point $21_m$ is chosen to be such that the impedance as viewed from the connection point $21_m$ toward the second reactance means $3_1, \ldots, 3_m$ is sufficiently large. In that case, the impedance as viewed from the connection point $22_m$ (or connection point $21_m$) toward the fifth reactance means $31_1, \ldots, 31_m$ will be sufficiently small. Accordingly, the impedance as viewed from the bias point 800 toward the first reactance means 2 will be sufficiently large. The electrical length from the connection point $21_m$ to the bias point 800 is equal to the electrical length from the connection point $21_m$ to the open-circuited end of the fourth reactance means 21. Therefore, when the impedance at the open-circuited end of the fourth reactance means is infinite, the DC circuit 5 and the DC power supply 6 can be prescinded from the AC circuit in terms of alternating current.

While one end of the fifth reactance means $31_1$ (the end to which the fifth reactance means $31_2$ is not connected) is open-circuited herein, the end may be grounded via second capacitive means such as a capacitor.

Sixth Embodiment

Figure 13:
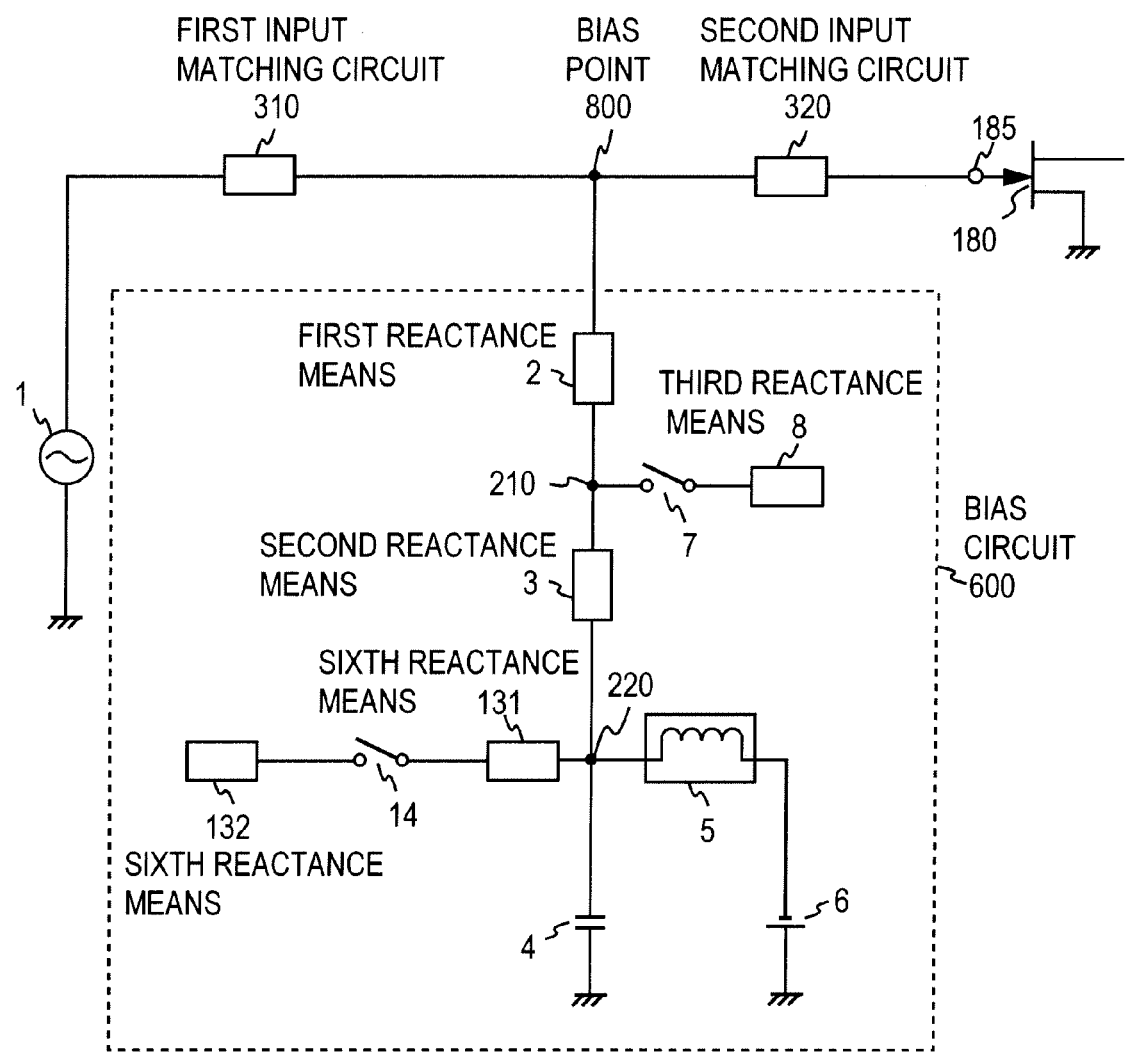
FIG. 13 is a block diagram showing a bias circuit according to a sixth embodiment of the present invention.

FIG. 13 shows a sixth embodiment of the present invention. In the sixth embodiment, sixth reactance means 131 and 132 and a switch 14 are added to the bias circuit 100 of the first embodiment. The sixth reactance means 131 and 132 are not limited to means of the same type. For example one of them may be implemented as a transmission line and the other as a lumped-parameter element. The sixth reactance means 131 is connected with the capacitive means 4, the DC circuit 5, and second reactance means 3 at the second connection point 220.

At a second frequency $f_2$, the switch 14 is in the off state. The reactance value of the sixth reactance means 131 is designed so that the second connection point 220 is short-circuited at the second frequency $f_2$. For example, the sixth reactance means 131 may be implemented by a transmission line having a line length of $\lambda_2/4$.

At a first frequency $f_1$, the switch 14 is turned on. The reactance value of the sixth reactance means 132 is designed so that the second connection point 220 is short-circuited at the first frequency $f_1$. For example, if the line length of the sixth reactance means 131 is $\lambda_2/4$, the sixth reactance means 132 may be implemented by a transmission line having a line length of $(\lambda_1/4 - \lambda_2/4)$.

Thus, the second connection point 220 can be short-circuited for AC signals of different frequencies even if the capacitance of the capacitive means 4 is not sufficiently large.

While the above components are added to the bias circuits of the first embodiment to form the bias circuit of the sixth embodiment, the present invention is not so limited. Technical features described with respect to the sixth embodiment can also be applied to any of the second to fifth embodiments.

[Generalization]

Bias circuits according to the present invention will be generalized with respect to the embodiments described above.

When the frequency of an AC signal (AC frequency) passing through an AC circuit 120 changes, the position (open position), from which the impedance as viewed toward a DC circuit 5 is sufficiently large, changes between the other end of first reactance means 2 one end of which is connected to a bias point 800 and the other end of capacitive means 4 the one end of which is grounded. Therefore, even if a bias circuit is designed so that the impedance as viewed from the bias point 800 toward the bias circuit is sufficiently large at an AC frequency $f_a$, for example, the impedance as viewed from the bias point 800 toward the bias circuit will not be sufficiently large at a different AC frequency $f_b$ from an AC frequency $f_a$. To make the impedance as viewed from the bias point 800 toward the bias circuit sufficiently large at AC frequency $f_b$ as well, a reactance is provided by a reactance providing means to the open position at frequency $f_b$ so that the impedance as viewed from the bias point 800 toward the bias circuit becomes sufficiently large. Generally, the reactance providing means may provide a reactance to open positions that vary depending on AC frequencies.

Here, if reactances are to be provided to all open positions that depend on the different AC frequencies, Condition 1: reactance at an AC frequency $f_r$ may be designed such that the impedances as viewed from open positions at the AC frequencies other than the AC frequency $f_r$ toward the reactance providing means are sufficiently large; Condition 2: The Condition 1 holds for each AC frequency; and Condition 3: at each AC frequency, the impedance as viewed from the bias point 800 toward the bias circuit is sufficiently large; are satisfied. Of course, in addition to the reactances provided by the reactance providing means, the reactance of first reactance means and the reactance of each of second reactance means are also designed so that the conditions given above are satisfied. In designing, it must be kept in mind that the open position at an AC frequency $f_r$ is possibly affected by the reactances provided to the open positions at the AC frequencies other than the AC frequency $f_r$.

On the other hand, if a reactance is to be provided to at least one of the open positions that depend on the AC frequencies, the reactance providing means may be made connectable to each open position via one switch, and the switch may be turned on and off in accordance with an AC frequency. The connection point to which the switch that is closest to the bias point is connected among the switches turned on is the open position at an AC frequency when the switch is turned on. In such a configuration, the impedance as viewed from the open position toward the capacitive means 4 is sufficiently large and the flexibility of the configuration and design of the reactance providing means is high. This can be readily understood by employing as an example the bias circuit 400 in which the reactance providing means includes n third reactance means $8_1, \ldots, 8_q$. When only a switch $7_m$ is in the on state in the bias circuit 400, a parallel resonant circuit is formed between a connection point $21_m$ and a ground by circuit part X including second reactance means $3_1, \ldots, 3_m$, capacitive means 4, a DC circuit 5, and a DC power supply 6 and circuit part Y including third reactance means $8_m$ and second capacitive means $9_m$. Because the impedance $Z_x$ of circuit part X is sufficiently large, the impedance $Z_P=1/(1/Z_X+1/Z_Y)$ of the parallel resonant circuit is determined in effect by the impedance $Z_Y$ of circuit part Y. The reactance means does not provide a reactance between the bias point and the connection point $21_m$ which is an open position. Accordingly, when only the switch $7_m$ is in the on state, the impedance as viewed from the bias point 800 toward the bias circuit 400 may be considered to be the combined impedance of the impedance of the first reactance means 2, the impedance of each second reactance means $3_{m+1}, \ldots, 3_n$, and the impedance $Z_Y$ of circuit part Y. Thus, practically the configuration and design of the reactance providing means is not affected by circuit part X and the design of the reactance provided to the connection point $21_m$ at an AC frequency $f_m$ is not affected by the designs for the other AC frequencies. Therefore the flexibility of the configuration and design of the reactance means is high.

The reactance providing means in the bias circuit described above can be configured as described with respect to the third embodiment.

Bias circuits of the present invention are not limited to the embodiments described above. Modifications are permitted to be made as appropriate according to the usage unless departed from the inventive concept.

[Combined Use of a Bias Circuit and a Multiband Matching Circuit]

Figure 14:
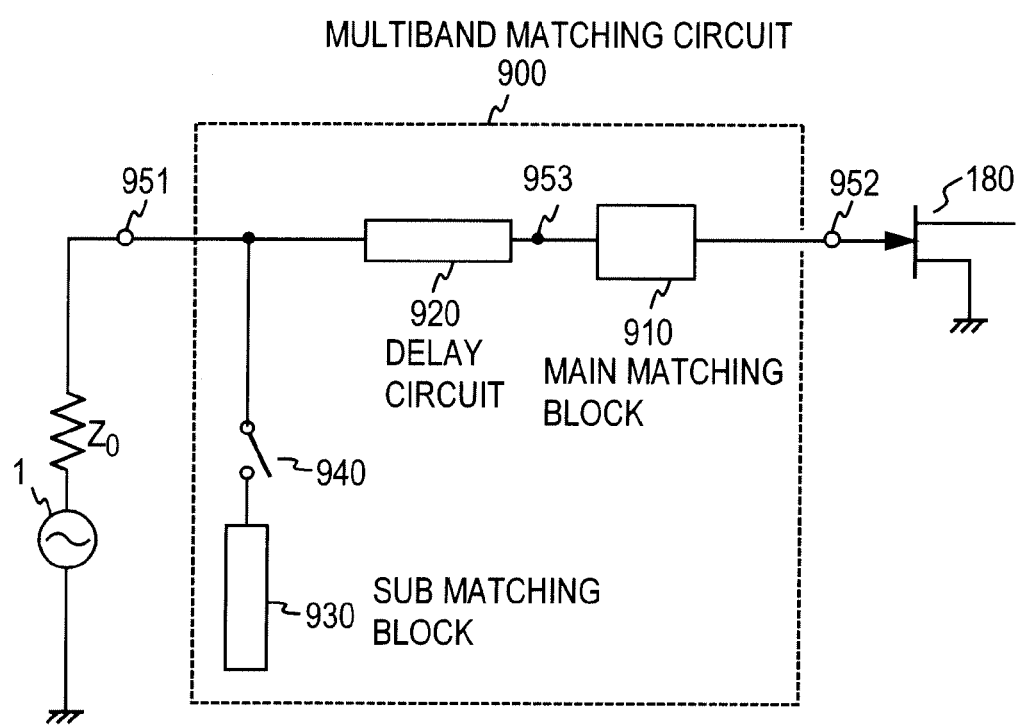
FIG. 14 is a block diagram showing an exemplary configuration of a multiband matching circuit.

FIG. 14 illustrates a low-loss multiband matching circuit 900 described in literatures Non Patent Literature 1 and 2 listed above. A multiband matching circuit 900 capable of operating at each of two bands is illustrated for convenience of illustration of a combined use with the bias circuit of the first embodiment described above. The multiband matching circuit 900 comprises a main matching block 910, a delay circuit 920 one end of which is connected to the main matching block 910, a sub matching block 930, and a switch 940 connected between the other end of the delay circuit 920 and one end of the sub matching block 930. In the multiband matching circuit 900 shown in FIG. 14, one end of the main matching block 910 (the end to which the delay circuit 920 is not connected) is connected to the FET 180 in FIG. 14 whose impedance Z(f) has a frequency characteristics. One end of the delay circuit 920 (the end to which the main matching block 910 is not connected) is connected to a load (AC signal source 1 in FIG. 14). The multiband matching circuit 900 matches the impedance Z(f) as viewed from a port 952 toward the FET 180 in a signal band to the impedance $Z_0$ of the load (AC signal source 1).

Impedance matching at a frequency $f_1$ will be described first. In this case, the switch 940 is turned off. For example, a signal input through the port 951 passes only through the main matching block 910 and the delay circuit 920 and travels to the port 952. It is assumed here that the main matching block 910, which may have any configuration, matches impedance $Z(f_1)$ to impedance $Z_0$ at frequency $f_1$. Also, it is assumed that the delay circuit 920 is a transmission line which has the characteristic impedance $Z_0$. Accordingly, the impedance value as viewed from the port 951 toward the multiband matching circuit 900 is $Z_0$. That is, the multiband matching circuit 900 establishes impedance matching throughout the circuit at frequency $f_1$.

Based on the design for the impedance matching at frequency $f_1$ described above, impedance matching at frequency $f_2$ will be described next. In this case, the switch 940 is turned on. The main matching block 910 operates as an impedance converter at frequency $f_2$ as well. Accordingly, the impedance as viewed from a point 953 toward the port 952 will be impedance $Z_L'(f_2)$ converted from the impedance $Z_L(f_2)$ of the port 952.

By presetting an appropriate line length of the delay circuit 920 configured by a transmission line and an appropriate reactance value of the sub matching block 930 branching-connected with the delay circuit 920 as design parameters in accordance with impedance $Z_L'(f_2)$, the impedance value as viewed from the port 951 toward the multiband matching circuit 900 can be converted to $Z_0$ on the principle of single stub matching. That is, the multiband matching circuit 900 can establish impedance matching throughout the circuit at frequency $f_2$ as well.

By adding the sub matching block 930 and, via the switch 940, the delay circuit 920 having characteristic impedance $Z_0$ to the main matching block 910, the multiband matching circuit 900 can be designed to operate as a matching circuit at each of frequencies $f_1$ and $f_2$. That is, the multiband matching circuit 900 functions as a matching circuit for two frequency bands by switching the state (on/off) of a single switch.

Figure 15:
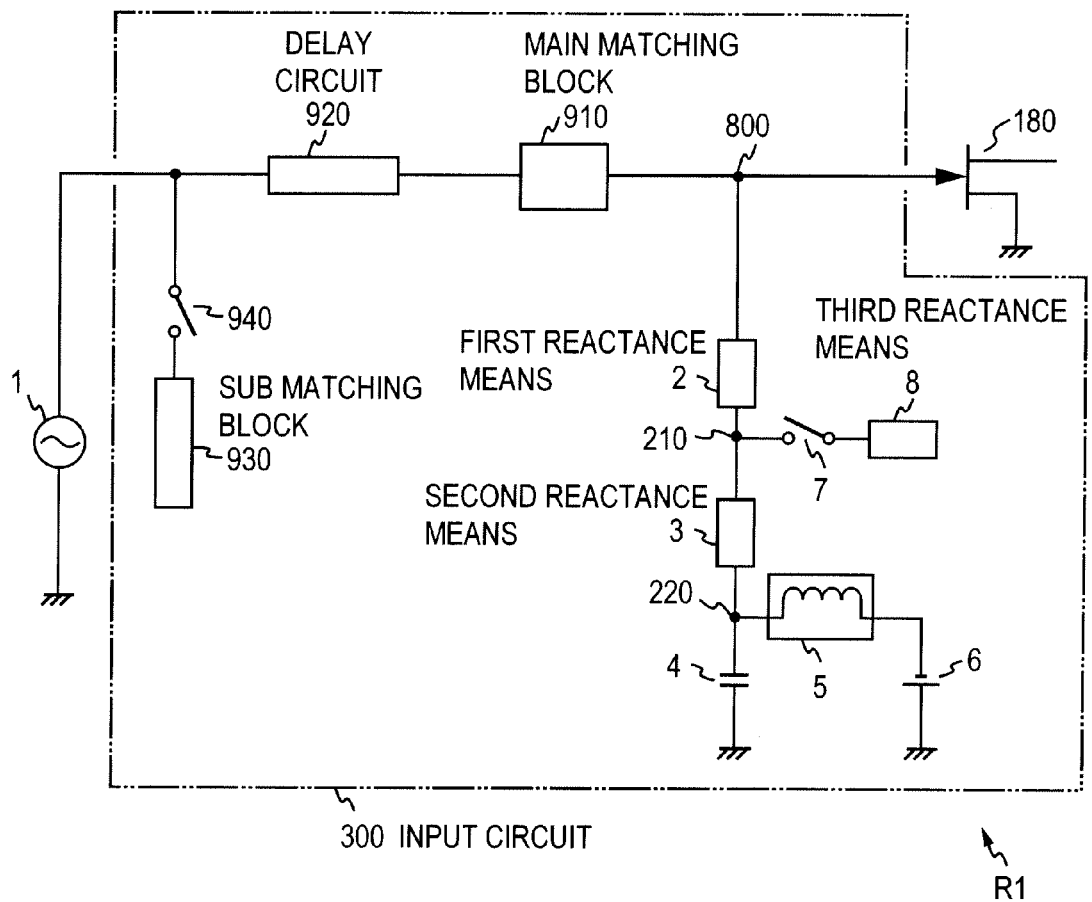
FIG. 15 is a block diagram showing an exemplary configuration of a combination of a multiband matching circuit and a bias circuit according to one embodiment of the present invention.

FIG. 15 shows a combined use of the multiband matching circuit 900 and the bias circuit 100 capable of operating at each of two bands according to the first embodiment described above. It can be said that the combined use is a variation of the first embodiment, in which the second input matching circuit 320 of the first embodiment is omitted and the first input matching circuit 310 is replaced with the multiband matching circuit 900.

In the combined use of the multiband matching circuit 900 and the bias circuit 100 shown in FIG. 15, both of switch 7 and switch 940 are turned off at a first frequency $f_1$ and are turned on at a second frequency $f_2$. At the first frequency $f_1$, impedance matching can be accomplished by the main matching block 910 and the delay circuit 920. At the second frequency $f_2$, impedance matching can also be accomplished by taking into consideration the existence of first reactance means 2 and third reactance means 8 in terms of alternating current, as well as the main matching block 910, delay circuit 920 and sub matching block 930.

While the combined use described above is capable of operating at each of two bands, an amplifier circuit capable of operating at each of (n+1) bands can be implemented by combining the multiband matching circuit capable of operating at each of (n+1) bands disclosed in the literatures listed above with any of the third, fourth and fifth embodiment of the present invention.

[Comparison of the Present Invention with Conventional Art]

Figure 16:
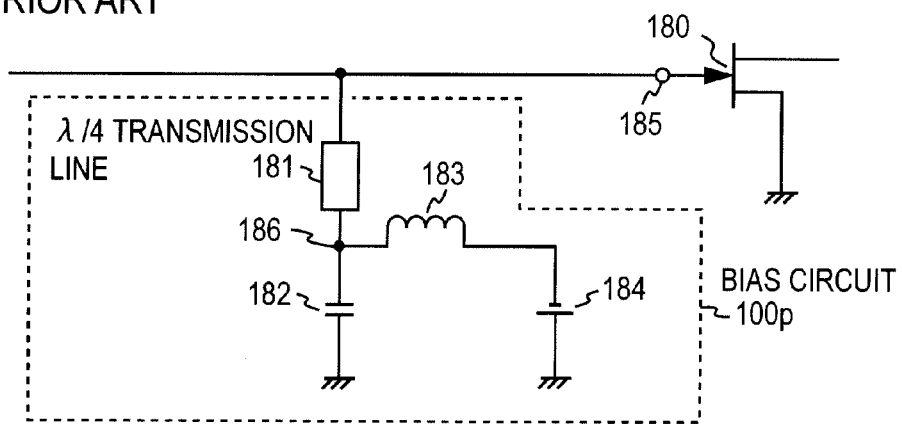
FIG. 16 is a block diagram showing an exemplary configuration of a conventional bias circuit.

As will be understood from the description of the bias circuit shown in FIG. 16, conventional bias circuits can operate as a bias circuit for only a particular frequency but cannot operate at each of multiple frequency bands.

The method disclosed in Patent Literature 2 listed above of operating a bias circuit at each of multiple frequency bands has a problem that the entire bias circuit increases in size because the method basically requires the bias circuit shown in FIG. 16 for each frequency as the number of bands.

The method disclosed in Patent Literature 3 listed above of operating at each of multiple frequency bands has a similar problem because it needs multiple bias circuits prepared as described in the literature.

Bias circuits as many as the number of bands that requires bias circuits may be provided in order to operate at each of the multiple frequency bands. However, the size of the circuits unrealistically increases in consequences.

According to the present invention, in contrast to conventional art, impedance as viewed from a bias point toward a bias circuit can be made sufficiently large by a reactance provided with respect to different AC frequencies by a reactance providing means provided in the bias circuit as can be seen from the description of the embodiments described above, and therefore a DC voltage can be supplied to an AC circuit without affecting an AC signal transmitted in the AC circuit. Thus, a bias circuit capable of operating at each of multiple frequency bands can be realized. Because multiple frequency bands can be handled by a single bias circuit, it is not necessary to provide as many bias circuits as the number of operating frequency bands.

What is claimed is:

1. A bias circuit connected to an alternating-current circuit, comprising:
    a first reactance means one end of which is connected to said alternating-current circuit;
    a capacitive means one end of which is grounded;
    a direct-current circuit part capable of supplying a direct-current voltage;
    one or more second reactance means; and
    a reactance providing means capable of providing a reactance;
    wherein each of said second reactance means is cascade-connected between the other end of said first reactance means and the other end of said capacitive means;
    said direct-current circuit part is connected to a connection point (hereinafter referred to as connection point R) between said capacitive means and said second reactance means which is connected to said capacitive means;
    said connection point R is grounded in terms of alternating current; and
    said reactance providing means is capable of providing a reactance to an open position (hereinafter referred to as the open position) from which an impedance as viewed toward said capacitive means is sufficiently large between the other end of said first reactance means and the other end of said capacitive means in accordance with an alternating-current frequency (hereinafter referred to as the alternating-current frequency) of an alternating-current signal passing through said alternating-current circuit so that an impedance as viewed from a bias connection point (hereinafter referred to as the bias point) between said alternating-current circuit and said first reactance means is sufficiently large.

2. The bias circuit according to claim 1, comprising one or more switches; wherein
    one end of one of said one or more switches is connected between adjacent two of reactance means located between said bias point and the other end of said capacitive means;
    the other end of each of said switches is connectable to said reactance providing means;
    an on or off state of each of said switches is selected in accordance with said alternating-current frequency; and
    a connection point (hereinafter referred to as connection point S) to which the switch closest to said bias point among said switches in the on state between said bias point and the other end of said capacitive means is connected is the open position at the alternating frequency when at least one of said switches is in the on state.

3. The bias circuit according to claim 2, wherein
    the number of said second reactance means is one;
    the number of said switches is one;
    said switch is placed in the off state when said alternating-current frequency is a first frequency $f_1$; and
    said switch is placed in the on state when said alternating-current frequency is a frequency different from the first frequency $f_1$.

4. The bias circuit according to any of claims 1 to 3, wherein
    said reactance providing means has a reactance value changeable among q values, where q is an integer greater than or equal to 2.

5. The bias circuit according to claims 2 or 3, wherein
    said reactance providing means comprises q reactance elements, where q is an integer greater than or equal to 2; and
    the other end of said switch is connectable to one end of one of said q reactance elements.

6. The bias circuit according to claims 2 or 3, wherein
    said reactance providing means comprises q reactance elements and q−1 selector switches (hereinafter referred to as the selector switches), where q is an integer greater than or equal to 2;
    the other end of said switch connected to said open position is connected to one end of first one of said q reactance elements; and
    one end of x-th one of said selector switches is connected to the other end of x-th one of said q reactance elements and the other end of the x-th selector switch is connected to one end of (x+1)-th one of said q reactance elements, where x=1, 2, 3, ..., q−1.

7. The bias circuit according to any of claims 1 to 3, wherein
    the other end of said reactance providing means is connected to one end of a second capacitive means the other end of which is grounded.

8. The bias circuit according to claim 4, wherein
    the other end of said reactance providing means is connected to one end of a second capacitive means the other end of which is grounded.

9. The bias circuit according to claim 5, wherein
    the other end of at least one of said q reactance elements is connectable to one end of a second capacitive means the other end of which is grounded.

10. The bias circuit according to claim 6, wherein
    the other end of q-th one of said q reactance elements is connectable to one end of a second capacitive means the other end of which is grounded.

11. The bias circuit according to claim 6, wherein
    the other end of at least one of said selector switches is connectable to one end of a second capacitive means the other end of which is grounded.

12. The bias circuit according to claim 2, wherein
    the number of said second reactance means is n, where n is an integer greater than or equal to 2;
    the number of said switches is n;
    said reactance providing means comprises n third reactance means;
    the other end of each of said switches is connected to one end of one of said third reactance means;

all of said switches are placed in the off state when said alternating-current frequency is the first frequency $f_1$; and at least one of said switches is placed in the on state when said alternating-current frequency is the (m+1)-th frequency $f_{m+1}$, where m is an integer greater than or equal to 1 and less than or equal to n.

13. The bias circuit according to claim 12, wherein
the other end of at least one of said third reactance means is connected to one end of a second capacitive means the other end of which is grounded.

14. The bias circuit according to claim 12, wherein
at least one of said third reactance means comprises a transmission line and the other end of at least one of said third reactance means comprising said transmission line is an open-circuited end of said transmission line.

15. The bias circuit according to claim 2, wherein
the number of said reactance means is n, where n is an integer greater than or equal to 2;

the number of said switches is n;

said reactance providing means comprises one fourth reactance means and n fifth reactance means;

said n fifth reactance means are cascade-connected, where the fifth reactance means at one end of the set of the cascade-connected n fifth reactance means is referred to as fifth reactance means γ and the fifth reactance means at the other end is referred to as the fifth reactance means θ;

an end of said fifth reactance means γ that is not connected to any of the other fifth reactance means is connected to one end of said fourth reactance means the other end of which is open-circuited;

one end of said switch the other end of which is connected to a connection point between said first reactance means and said second reactance means which is connected to said first reactance means is connected to a connection point between said fifth reactance means γ and said fourth reactance means;

the other end of each switch connected to a connection point between adjacent two of said second reactance means is connected to an connection point between said cascade-connected fifth reactance means;

said second reactance means are associated with the fifth reactance means in a one-to-one correspondence;

said fourth reactance means has the same reactance value as that of said first reactance means;

each of said n fifth reactance means has the same reactance value as that of said second reactance means associated with the fifth reactance means;

all of said switches are placed in the off state when said alternating-current frequency is (2k−1) times higher than the first frequency $f_1$, where k is an integer greater than or equal to 1; and only one of said switches is placed in the on state when said alternating-current frequency is 2k times higher than the first frequency $f_1$.

16. The bias circuit according to claim 15, wherein
an end of said fifth reactance means θ that is not connected to any of the other fifth reactance means is connected to one end of a second capacitive means the other end of which is grounded.

17. The bias circuit according to claim 15, wherein
said fifth reactance means θ comprises a transmission line; and an end of said fifth reactance means θ that is not connected to any of the other fifth reactance means is an open-circuited end of said transmission line.

* * * * *